United States Patent
Hwang et al.

[11] Patent Number: 5,986,490
[45] Date of Patent: Nov. 16, 1999

[54] AMPLIFIER-BASED FLIP-FLOP ELEMENTS

[75] Inventors: Yi-Ren Hwang, Fremont; Dennis L. Wendell, Pleasanton; Hamid Partovi, Sunnyvale, all of Calif.

[73] Assignee: Advanced Micro Devices, Inc., Sunnyvale, Calif.

[21] Appl. No.: 08/993,081

[22] Filed: Dec. 18, 1997

[51] Int. Cl.⁶ .................................................. H03K 3/289
[52] U.S. Cl. ........................ 327/202; 327/215; 327/212
[58] Field of Search ............................ 327/55, 57, 202, 327/203, 215, 216, 217, 218, 91, 94, 199, 208, 212

[56] References Cited

U.S. PATENT DOCUMENTS 5,281,865  1/1994  Yamashita et al. ...................... 327/202
5,497,115  3/1996  Millar et al. ............................. 327/215
5,576,651  11/1996  Phillips ................................... 327/202

Primary Examiner—Toan Tran
Attorney, Agent, or Firm—Skjerven, Morrill, MacPherson, Franklin & Friel LLP; Ken J. Koestner

[57] ABSTRACT

A current-sensing static amplifier-based flip-flop is useful for high-performance VLSI circuitry. The flip-flop has a short latency and a small hold time, advantageous features in high-performance microprocessors. A flip-flop circuit includes an amplifier stage and a static stage. The amplifier stage has a data input terminal and a clock input terminal. The amplifier stage includes a dual-output amplifier having two output lines connected respectively to two current pulldown paths and a gate connected between the current pulldown paths. The static stage is connected to the amplifier stage and including a static latch.

15 Claims, 6 Drawing Sheets

AMPLIFIER-BASED FLIP-FLOP ELEMENTS

BACKGROUND OF THE INVENTION

1. Field of the Invention

The present invention relates to flip-flop circuits. More specifically, the invention relates to amplifier-based flip-flop circuits for using in high-performance processors.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core. The execution speed of microprocessors is heavily analyzed and compared using standard benchmark tests for judging the performance of competing entries into the microprocessor market.

Hold time is an important characteristic of electronic circuits that is specified to particular tolerances in a circuit design. Unlike setup time, variations of which are tolerated by slowing down the system clock, failure to meet the hold time specification result in a nonfunctional part. Currently a popular technique for setting hold time to defined tolerances is by insertion of delay cells between flip-flops. A difficulty with the usage of delay cells is that care must be exercised to avoid slowing down critical timing paths.

Referring to FIG. 1, labeled prior art, a schematic circuit diagram illustrates a conventional strobed amplifier flip-flop (SAFF) 100 including a strobed amplifier 102, followed by an RS-latch 104. The strobe amplifier flip-flop circuit 100 has a very good hold time due to the snapping nature of the amplifier input stage 102. Once the strobed amplifier 102 switches, a later change of input data D cannot overpower the strobed amplifier 102 and alter the state of the flip-flop 100. However, the RS-latch 104 includes two slow gate delays through cross-coupled NAND-gates 106 that adversely impact the CLK-to-Q performance of the strobe amplifier flip-flop circuit 100.

What is needed is a flip-flop circuit having a short latency and small hold time and is thus suitable for usage in high-performance VLSI circuitry.

SUMMARY

In accordance with an embodiment of the present invention, a current-steering strobed amplifier flip-flop circuit (CSSAFF) utilizes current steering to maintain a short hold time. In one embodiment, the current-steering strobed amplifier flip-flop attains a short hold time of approximately 5 psec in a proprietary 0.25 technology (Advanced Micro Devices™, Santa Clara, Calif.) with a typical device and 2.1V operation voltage. The current-steering strobed amplifier flip-flop also has a reduced latency (for example, 30%) in comparison to a conventional strobe amplifier flip-flop circuit.

In accordance with an embodiment of the present invention, a flip-flop circuit includes an amplifier stage and a static stage. The amplifier stage has a data input terminal and a clock input terminal. The amplifier stage includes a dual-output amplifier having two output lines connected respectively to two current pulldown paths and a gate connected between the current pulldown paths. The static stage is connected to the amplifier state and including a static latch.

Many advantages are achieved by the described current-steering strobed amplifier flip-flop. The described circuit attains a reduced hold time and short latency.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
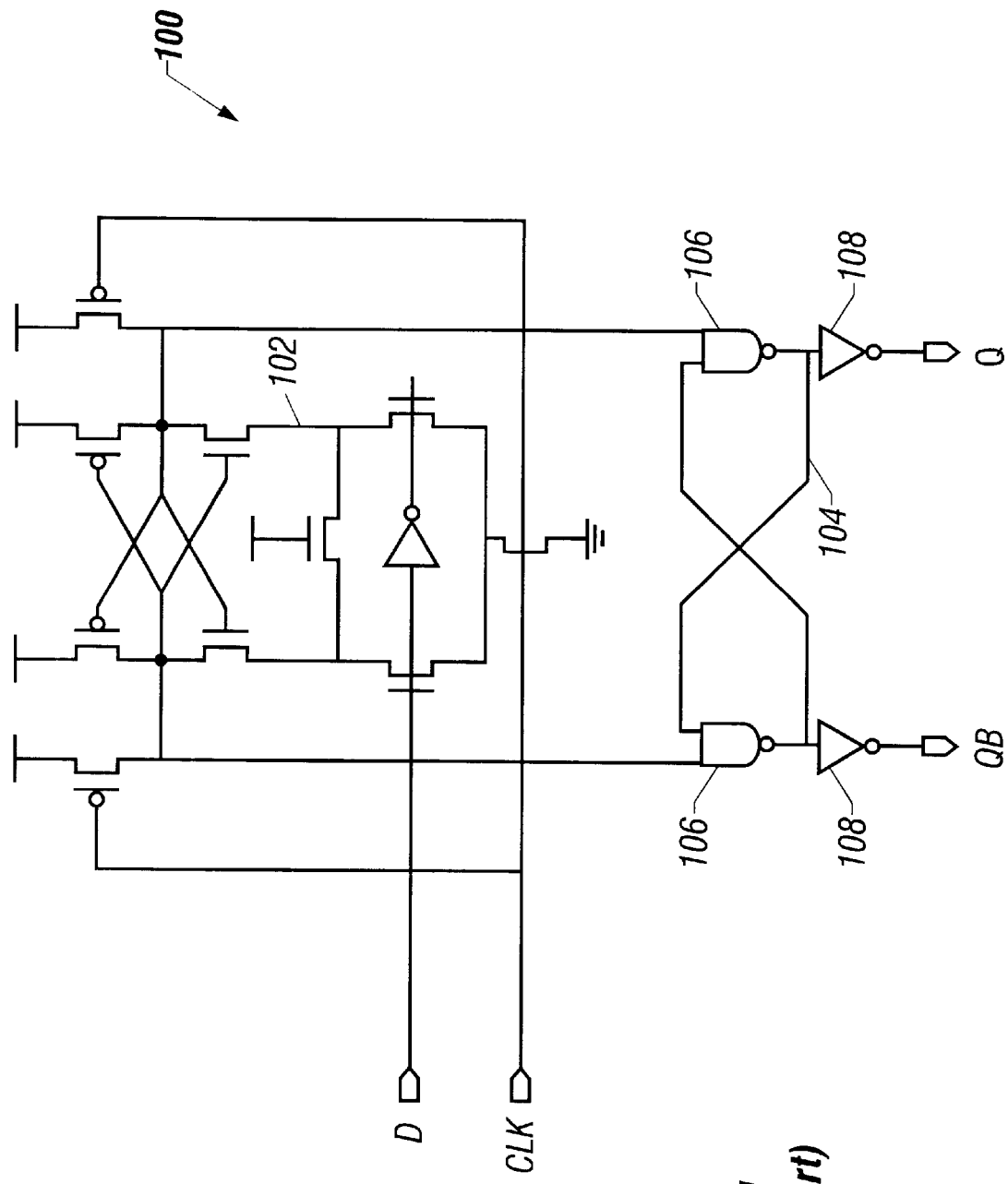
FIG. 1, labeled prior art, is a schematic circuit diagram which illustrates a conventional strobed amplifier flip-flop.
Figure 2:
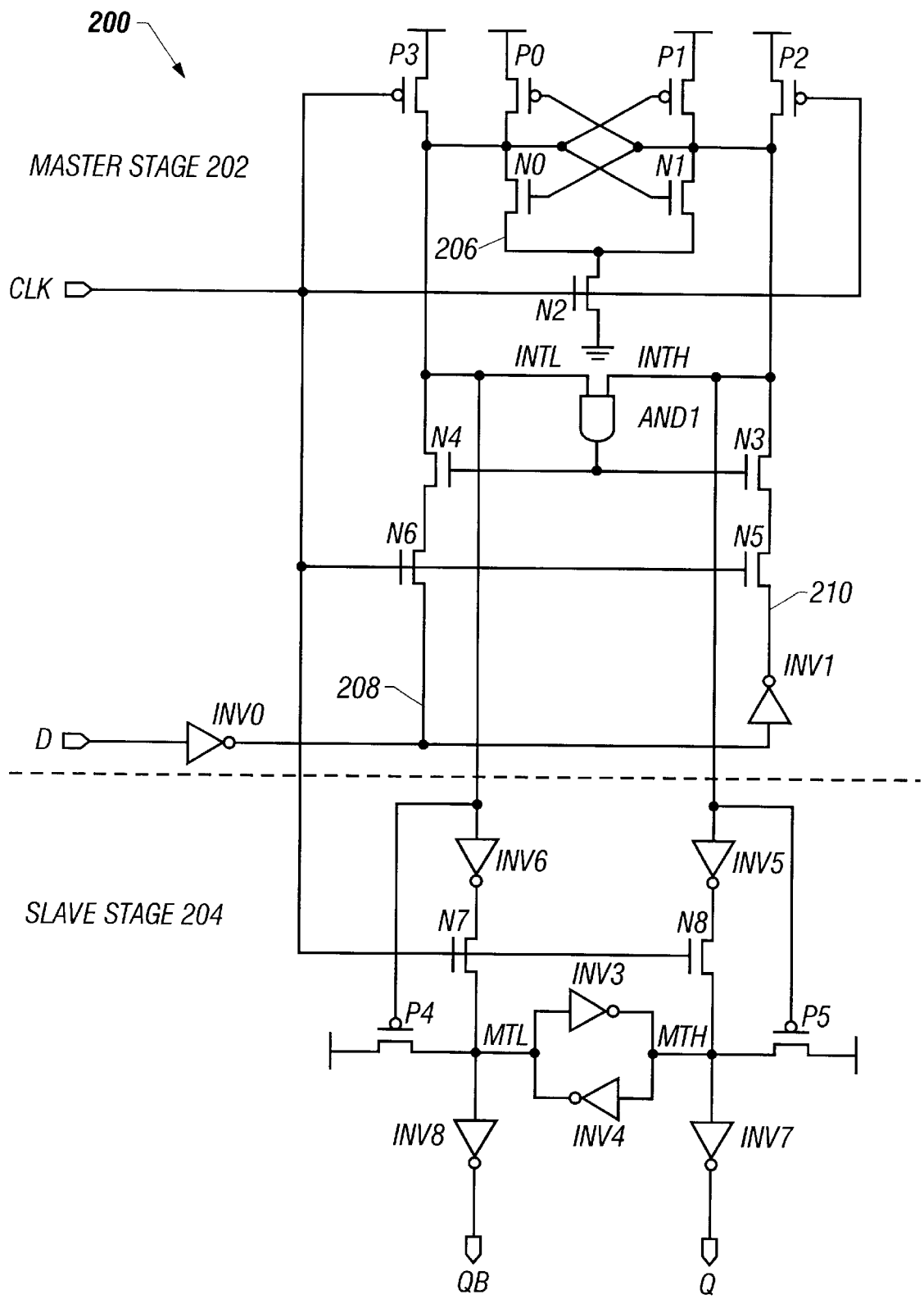
FIG. 2 is a schematic circuit diagram illustrating a current-steering sense-amplifier flip-flop (CSSAFF) in accordance with an embodiment of the present invention.

Referring to FIG. 2, a schematic circuit diagram illustrates an embodiment of a current-steering sense-amplifier flip-flop (CSSAFF) 200. The current-steering strobed amplifier flip-flop 200 includes a current-sensing-amplifier front end 202, which is also called a master stage, and a static latch back end 204, that is termed a slave stage. The current-steering strobed amplifier flip-flop 200 is employed in dual-rail applications and generates two output signals, Q and QB. One advantage of the current-steering strobed amplifier flip-flop 200 in comparison to the conventional strobe amplifier flip-flop circuit 100 is a capability to incorporate logic functions with a minimum delay penalty.

The current-steering strobed amplifier flip-flop 200 operates in response to a clock signal CLK and a data signal D. When the clock signal CLK is low, the current-steering strobed amplifier flip-flop 200 is in a precharge phase. An internal node low intl and an internal node high inth are both precharged high and output signals Q and QB are respectively disconnected from the internal node high inth and the internal node low intl by respective n-channel transistors N7 and N8. Also in the precharge phase, p-channel transistors P4 and P5 are also turned off. Inverters INV3 and INV4 of the static latch 204 hold the previous logic level of the output signals Q and QB. An AND gate AND1 turns on n-channel transistors N3 and N4 while n-channel transistors N5 and N6 are shut off by the clock signal CLK.

Following the precharge phase, the current-steering strobed amplifier flip-flop 200 enters an evaluation phase that begins with the rising edge of the clock signal CLK. The data input signal D is applied to the internal node high intl through the n-channel transistors N4 and N6, and an inverter INV0 in a first input current pulldown path. The data input signal D is also applied to the internal node low inth through the n-channel transistors N3 and N5, and inverters INV0 and INV1 in a second input current pulldown path. An amplifier 206 that includes n-channel transistors N0, N1, and N2, and p-channel transistors P0 and P1 is strobed by the clock signal CLK, causing either internal node high inth or internal node low intl to be discharged to a low state.

The driving forces that cause the internal node high inth and the internal node low intl to go either low or high are two current pulldown paths 208 and 210. The current path 208 passes through the inverter INV0 and the n-channel transistors N4 and N6. The current path 210 passes through the inverters INV0 and INV1, and the n-channel transistors N3 and N5. In a manner similar to the operation of the strobe amplifier flip-flop circuit 100, once the amplifier 206 flips, a later change in the input signal D does not change the output signal generated by the amplifier 206. Flipping of the amplifier 206 causes the two current pulldown paths 208 and 210 to be shut off by the AND gate AND1 which turns of the n-channel transistors N3 and N4 after the internal node high inth or the internal node low intl goes low. The purpose of the AND gate AND1 is to cut off the DC power consumption caused by potentially switching the input data signal D during the evaluation phase.

Also during the evaluation phase, the static latch 204 operates as a slave stage in which the n-channel transistors N7 and N8 are turned on by the clock signal CLK and the low-going edge of the internal node high inth or the internal node low intl flips the latch 204 composed of inverters INV3 and INV4.

The p-channel transistors P4 and P5 are included to assist in pulling the signal on a slave node high mth and a slave node low mtl completely to VDD due to the threshold voltage drop across the n-channel transistors N7 and N8. The n-channel transistors N7 and N8, the p-channel transistors P4 and P5, and the inverters INV5, INV6, INV7, and INV8 are sized in a manner well-known and commonly used for setting circuit performance characteristics so that output glitch is reduced substantially to zero.

Figure 3:
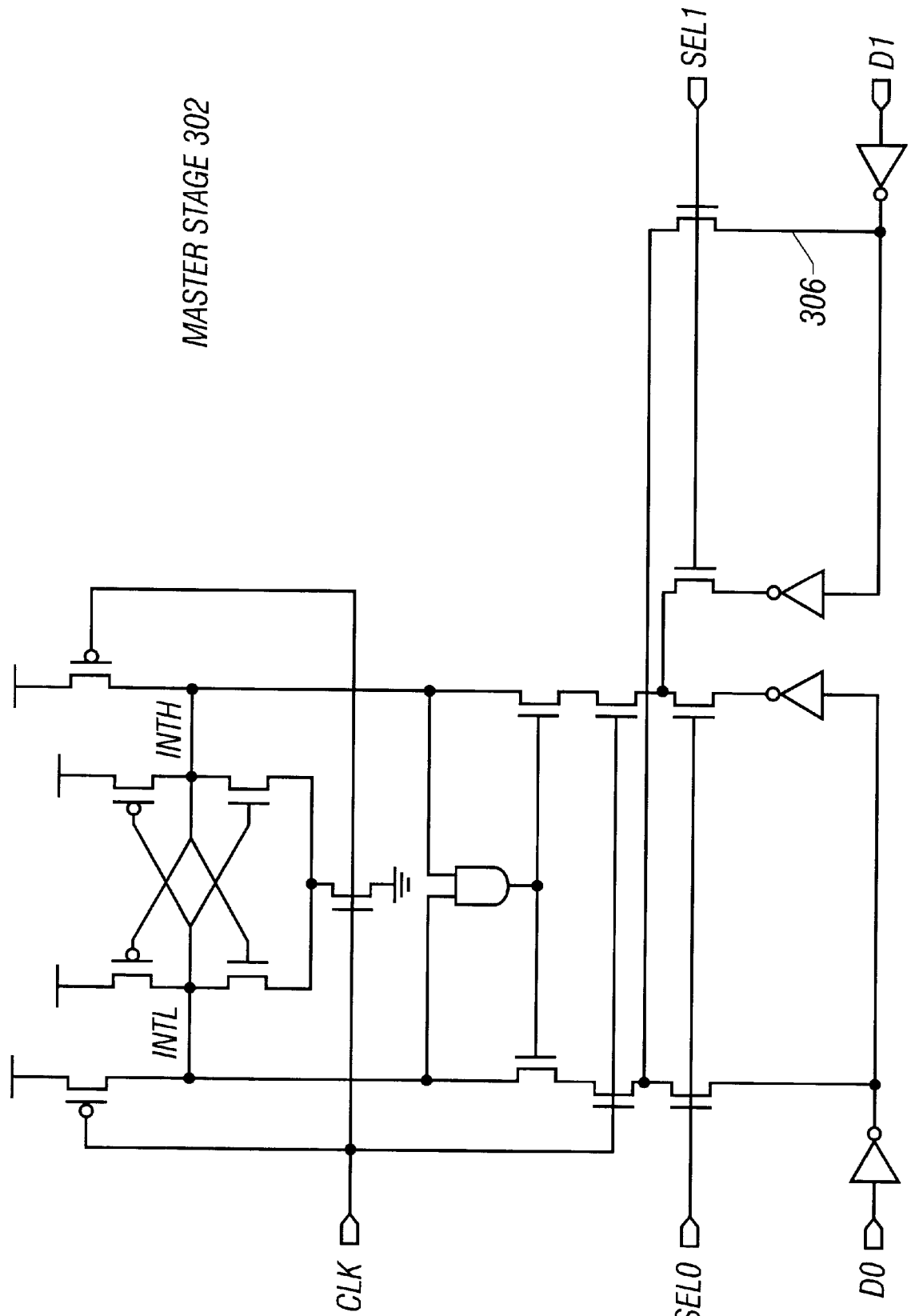
FIG. 3 is a schematic circuit diagram showing an alternative embodiment of a current-sensing-amplifier front end for usage in a current-steering strobed amplifier flip-flop.

Referring to FIG. 3, a schematic circuit diagram illustrates an alternative embodiment of a current-sensing-amplifier front end 302 for usage in a current-steering strobed amplifier flip-flop. The current-sensing-amplifier front end 302 or master stage includes a two-to-one multiplexer 306. The master stage 302 is useful as a dynamic input stage with highly suitable performance in integrated circuits.

Figure 4:
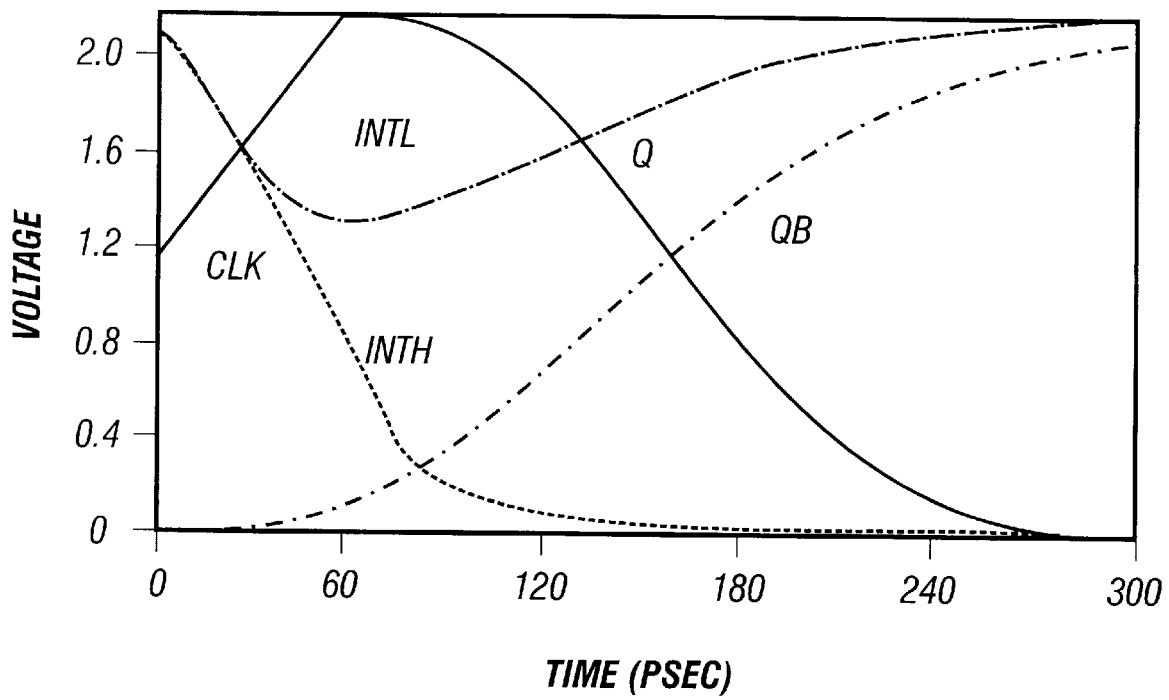
FIG. 4 is a graph illustrating simulated (SPICE) time-voltage waveforms and showing the behavior of the current-steering strobed amplifier flip-flop.

Referring to FIG. 4, a graph illustrates simulated (SPICE) time-voltage waveforms showing the behavior of the current-steering strobed amplifier flip-flop 200. The graph shows the voltage at internal nodes inth and intl, and the output signal voltages Q and QB in response to the clock signal CLK. The graph illustrates that the CLK-to-Q performance of the current-steering strobed amplifier flip-flop 200 is enhanced by ratioing the inverters INV5 and INV6 in favor of an input high-to-low transition because both nodes, internal node high inth and internal node low intl are precharged high.

Figure 5:
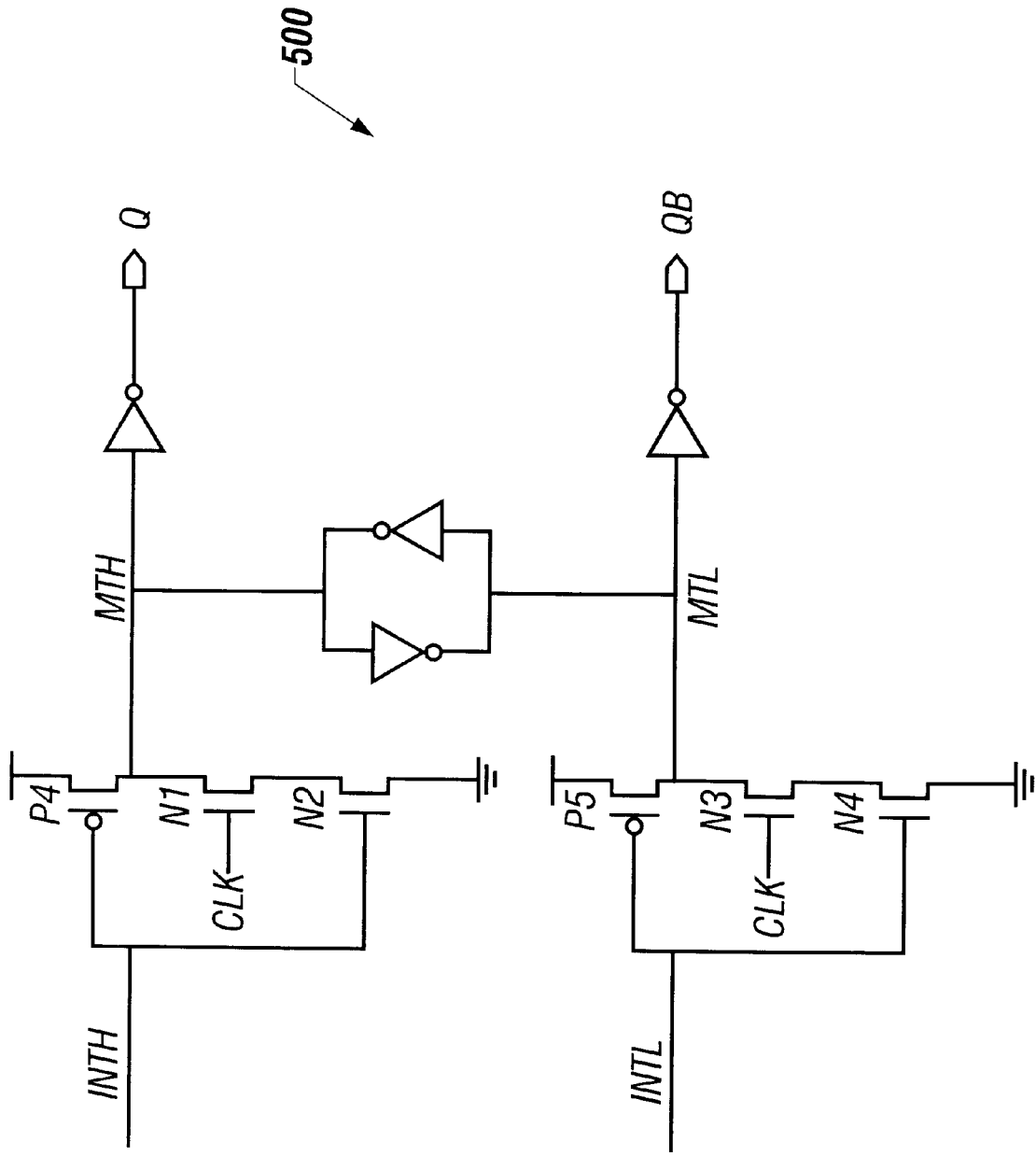
FIG. 5 is a schematic circuit diagram that depicts an embodiment of a TYPE1 slave stage that may be used as the static latch back end.

Referring to FIG. 5, a schematic circuit diagram depicts an embodiment of a TYPE1 slave stage 500 that may be used as the static latch back end 204. The TYPE1 slave stage 500 may be used with the current-sensing-amplifier front end 202 shown in FIG. 2, the current-sensing-amplifier front end 302 shown in FIG. 3, or any other suitable amplifier circuit. Similarly, various suitable static latch circuits may be utilized as a static latch back end 204.

For the current-steering strobed amplifier flip-flop 200, the p-channel transistors P4 and P5 are small devices relative to other transistors in the current-steering strobed amplifier flip-flop 200 and the pullup of the slave nodes mth and mtl is mainly through the inverter INV5 or the inverter INV6. In the TYPE1 slave stage 500, the pullup process only relies on large PMOS transistors P4 and P5 which has a disadvantageous consequence. In an exemplary condition, the slave node mth is assumed to be originally high and becomes low in a subsequent clock cycle. As the clock signal CLK goes high, n-channel transistors N1 and N2 pull down the slave node mth which couples internal node high inth down through the gate-drain-overlap capacitance of the large p-channel transistor P4. During a vulnerable period when the master stage 202 is evaluating, the disturbance increases the equivalent input referenced offset to the current-steering amplifier 206.

Figure 6:
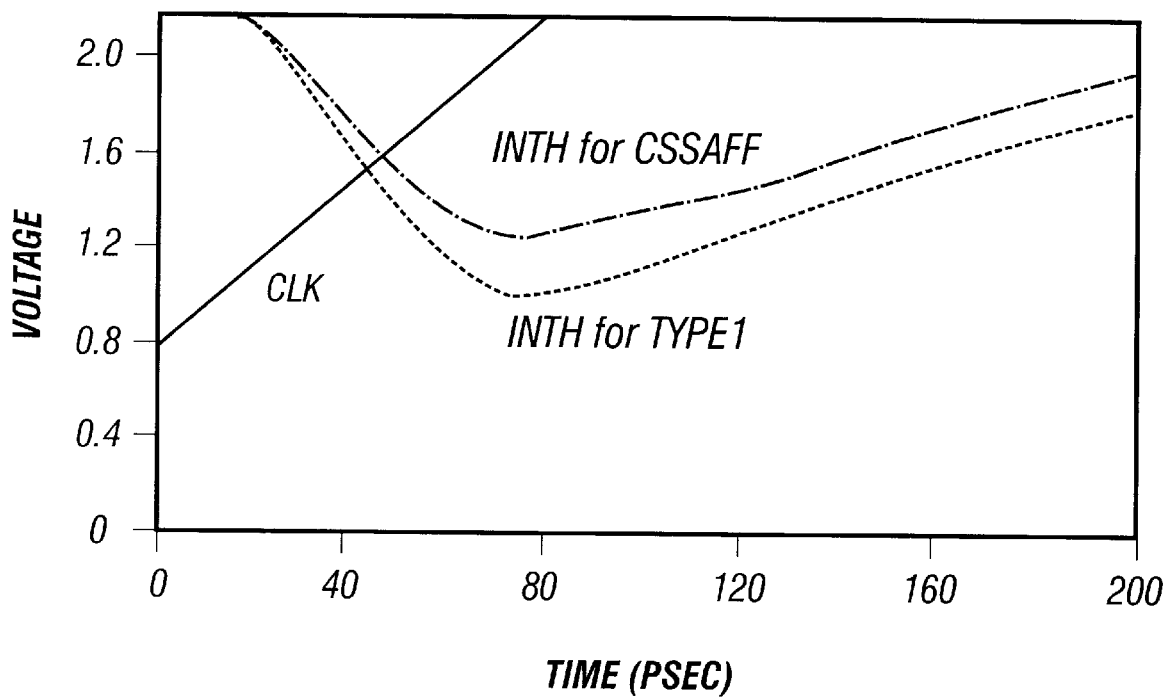
FIG. 6 is a graph which illustrates time-voltage waveforms comparing the behavior of a flip-flop (not shown) using the TYPE1 slave stage and the current-steering strobed amplifier flip-flop.

Referring to FIG. 6, a graph illustrates simulated (SPICE) time-voltage waveforms showing the behavior of a flip-flop (not shown) using the TYPE1 slave stage 500. The voltage on the internal node high inth of the flip-flop using the TYPE1 slave stage 500 goes lower than the voltage on the internal node high inth of the current-steering strobed amplifier flip-flop 200. Consequently, the flip-flop using the TYPE1 slave stage 500 has a larger setup time than the current-steering strobed amplifier flip-flop 200 to build up a suitable signal to the input amplifier and the latency of the flip-flop is disadvantageously lengthened. The poorer latency of the flip-flop using the TYPE1 slave stage 500 worsens as the device scale of the circuit is reduced, leading to an increase of the overlap-to-overall capacitance ratio on the internal node high inth and the internal node low intl. TABLE I illustrates a comparison of the strobe amplifier flip-flop circuit 100, the current-steering strobed amplifier flip-flop 200, and a flip-flop utilizing the TYPE I slave stage 500. The analysis of the three flip-flops compares performance under the same clock and output load conditions.

TABLE I

|  | SETUP | CLK-TO-Q | HOLD |
|---|---|---|---|
| SAFF | 15 ps | 240 ps | 15 ps |
| CSSAFF | 15 ps | 167 ps | 5 ps |
| TYPE1 | 45 ps | 165 ps | −5 ps |

TABLE I shows that the current-steering strobed amplifier flip-flop 200 improves circuit performance. Most improvement results from lower latency and a reduced hold time.

Figure 7:
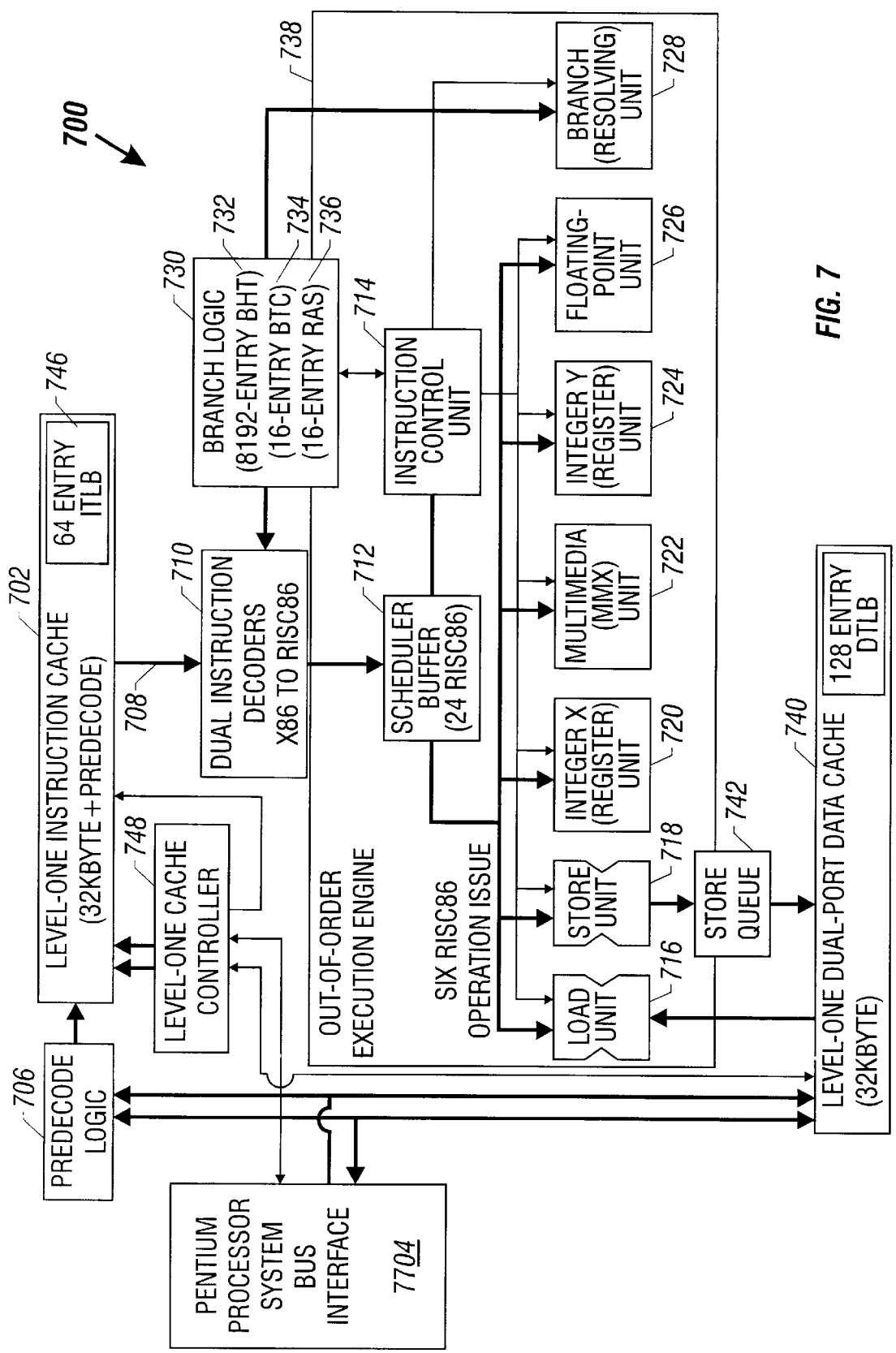
FIG. 7 is an architectural block diagram which illustrates an embodiment of a microprocessor in accordance with an embodiment of the present invention.

Referring to FIG. 7, a schematic block diagram illustrates an embodiment of an AMD-K6 microprocessor 700. The microprocessor 700 is a pipelined processor in which a flip-flop is used for each stage in each pipeline to latch data. The current-steering strobed amplifier flip-flop 200 is advantageously used to latch pipeline data in the microprocessor 700 to improve operating speed.

The microprocessor 700 is an X86 instruction set-compatible microprocessor implementing a set of Multi-Media eXtenstions (MMX). A level-one (L1) instruction cache 702 begins predecoding instructions obtained from a processor system bus interface 704 during filling of the 32 KB two-way associative L1 instruction cache 702. The L1 instruction cache 702 includes a 64-entry instruction translational lookaside buffer (ITLB) 746. Bypass (not shown) and storage buffers (not shown) for instructions (4×16) and predecode (4×20) to the L1 instruction cache 702 are supplied to allow data-in and data flow-back to cache output terminals.

In the L1 instruction cache 702, aliases are handled during cache line fills without penalty. The occurrence of an alias merely results in the invalidation of the appropriate cache line. In the L1 data cache 740, aliases for both read operations and write operations are handled by performing a state sequence that prevents disturbance from internal or external snoops while the lines are in process of eviction from the cache into a 4×64-bit write eviction buffer or write-back buffer (not shown). If an aliased line is dirty, the L1 instruction cache 702 performs a write back operation after the eviction into the write-back buffer. Once the alias is eliminated, the line is returned to the cache and deposited into a new set at a location corresponding to the new linear index.

The L1 instruction cache 702 uses a Most Recently Used (MRU) prediction technique to predict the way selection on cache accesses. A misprediction in the way selection results in a penalty of one cycle. The L1 instruction cache 702 line replacement algorithm is Least Recently Used (LRU) although an alternative random replacement algorithm is supported using an SR5.ICERLR configuration bit. The L1 instruction cache 702 also supports a direct-mapped replacement algorithm, reducing the cache size from 32 KB to 16 KB, using an SR5.ICDM configuration bit.

The L1 instruction cache 702 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

Predecode bits resolved during the predecoding operation are stored in a 20 KB predecode cache (not shown). Predecode logic 706 includes a first stage of instruction decode logic. Data from the L1 instruction cache 702 are fetched by fetch logic 708 and transferred to dual instruction decoders 710. The dual instruction decoders 710 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 710 are transferred to a RISC86 Op Scheduler and buffer 712. The RISC86 Op Scheduler 712 holds up to 24 RISC Ops and stores a total of 48 registers using register renaming. The RISC86 Op Scheduler 712, under control of an instruction control unit 714, issues up to six RISC86 Operations using out-of-order issuing to seven parallel execution units. The execution units speculatively execute the RISC86 Ops to generate results. The RISC86 Op Scheduler 712 retires the results in-order. The execution units include a load unit 716, a store unit 718, an integer X register unit 720, a Multi-Media eXtension (MMX) unit 722, an integer Y register unit 724, a floating-point unit (FPU) 726, and a branch resolving unit 728. A branch logic unit 730 implements a branch prediction operation that uses two-level branch prediction based on an 8192-entry Branch History Table (BHT) 732, a 16-entry Branch Target Cache (BTC) 734, and a 16-entry Return Address Stack (RAS) 736.

The dual instruction decoders 710 translate X86 instructions on-the-fly into corresponding RISC86 Ops. The RISC86 Ops are executed by an instruction core 738 that is essentially a RISC superscalar processing engine. The fetch logic 708 fetches up to sixteen instruction bytes each cycle from the L1 instruction cache 702 and transfers the instruction bytes into an instruction buffer (not shown) preceding the dual instruction decoders 710 so that the instruction buffer is maintained at capacity. The dual instruction decoders 710 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 712. The RISC86 Op Scheduler 712 controls and tracks multiple aspects of RISC86 Op issue and execution.

Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 712, functioning as a reorder buffer, commits the RISC86 Ops in-order to ensure precise exception handling and full operational compatibility with X86 architecture standards. The RISC86 Op Scheduler 712 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 712 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 716 loads data via a level-one (L1) dual-port data cache 740 which receives data from an external memory (not shown) via the processor system bus interface 704. Bypass (not shown) and storage buffers (not shown) for data (4×16) to the data cache 740 are supplied to allow data-in and data flow-back to cache output terminals.

The data cache 740 includes a 128-entry data translational lookaside buffer (DTLB) 744. The data cache 740 is a 2-way set-associative, 32 KB size cache with a 64 byte line-size and 32-byte sub-blocking. The data cache 740 fills on the basis of the 32-byte sub-block units. In contrast to the L1 instruction cache 702, the data cache 740 uses a Least Recently Missed (LRM) selection technique which is generally a more accurate way selection scheme than the LRU technique of the L1 instruction cache 702. In the LRM scheme, the line that first enters the cache is replaced. An alternative random replacement algorithm is supported and activated through usage of a SR5.DCERLR configuration bit. The data cache 740 also supports a direct-mapped replacement algorithm, reducing the cache size from 32 KB to 16 KB, using an SR5.DCDM configuration bit.

The data cache 740 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub--block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 740 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 718 transfers data to the data cache 740 through a store queue 742.

The MMX unit 722 is implemented to incorporate an X86 instruction subset called the Multi-Media eXtensions (MMX) thereby supporting a growing number of applications in the areas of communications and multimedia. The MMX unit 722 supports the new instructions and the new data types that are defined by the MMX standard to increase processor performance in the targeted applications. The MMX unit 722 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 722 supports 57 new instructions that execute additions, subtractions, multiplies, multiply-accumulates, logical shifts, arithmetic shifts, and several other operations. Most operations are executed on operands of any data type.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

The disclosed technique for coordinating timing of self-resetting or postcharge-type circuits is not only applicable to the task of accelerating the operation of an instruction cache but is also highly advantageous and suitable for more general problems such as coordinating the timing of pulses transferred chip-wide across a microprocessor, or other large, complex integrated circuit.

What is claimed is:

1. A flip-flop circuit comprising:
an amplifier stage having a data input terminal and a clock input terminal, the amplifier stage including a dual-output amplifier having first and second output lines coupled respectively to two current pulldown paths and a logic gate coupled to receive signals from the first and second output lines to control the current pulldown paths; and
a static stage coupled between the output lines, including a static latch.

2. A flip-flop circuit according to claim 1, wherein:
the dual-output amplifier has a strobe input coupled to the clock input terminal.

3. A flip-flop circuit according to claim 1, wherein:
each of the current pulldown paths include a first transistor having a control terminal controlled by an output signal from the gate and a second transistor coupled in series with the first transistor and having a control terminal controlled by a clock signal.

4. A flip-flop circuit according to claim 1, wherein the amplifier state includes:
the first pulldown path including a first transistor having a control terminal controlled by an output signal from the gate and a second transistor coupled in series with the first transistor and having a control terminal controlled by the clock signal;
the second pulldown path including a third transistor having a control terminal controlled by an output signal from the gate and a fourth transistor coupled in series with the third transistor and having a control terminal controlled by the clock signal; and
the gate having a first input terminal coupled to the first output line of the dual-output amplifier, having a second input terminal coupled to the second output line of the dual-output amplifier, and having an output terminal coupled to the control terminal of the first transistor and the third transistor.

5. A flip-flop circuit according to claim 1, wherein:
the gate is an AND-gate.

6. A processor comprising:
an execution engine;
instruction handling circuits coupled to the execution engine and supplying the instructions for execution by the execution engine, the instruction handling circuits including a plurality of pipelines, a stage of the pipelines having a flip-flop circuit including:
an amplifier stage having a data input terminal and a clock input terminal, the amplifier stage including a dual-output amplifier having first and second output lines coupled respectively to two current pulldown paths and a logic gate coupled to receive signals from the first and second output lines to control the current pulldown paths; and
a static stage coupled between the output lines, including a static latch.

7. A flip-flop circuit according to claim 1, wherein:
the static stage includes first and second complementary output signal pathways respectively coupled to the two output lines of the dual-output amplifier; and
the static latch coupled between the first and second complementary output signal pathways.

8. A flip-flop circuit according to claim 7, wherein the static stage further includes:
first and second pullup transistors coupled to the static latch and pulling the complementary output signals pathways of the static latch toward a high power supply.

9. A flip-flop circuit according to claim 7, wherein the static stage further includes:

a pair of switches for controllably connecting and disconnecting the first and second complementary output signal pathways and the respective two output lines of the dual-output amplifier.

10. A flip-flop circuit according to claim 7, wherein the static stage further includes:

a delay element in each of the first and second complementary output signal pathways.

11. A flip-flop circuit according to claim 10, wherein:

the delay element in the first complementary output signal pathway is size ratioed with the delay element in the second complementary output signal pathway in favor of a high-to-low transition to enhance the speed of the output signals in response to a clock signal at the clock input terminal.

12. A flip-flop circuit according to claim 7, wherein the static stage further includes:

an inverter element in each of the first and second complementary output signal pathways.

13. A method of operating a flip-flop including an amplifier having a data input, a clock input two output terminals coupled to a first internal node and a second internal node, and a static latch coupled to the internal nodes and generating first and second complementary output signals, the method comprising:

receiving a clock input signal at the clock input;

in a precharge phase:
    precharging the first and second internal nodes high;
    disconnecting the first and second complementary output signals from the respective first and second internal nodes;
    holding a previous logic level state of the first and second complementary output signals; and
    transitioning to an evaluation phase on a rising edge of the clock input signal; and in the evaluation phase:
    inverting a data input signal;
    applying the data input signal and the inverted data input signal respectively to the first and second internal nodes;
    strobing the amplifier using via the clock input signal;
    responsive to strobing the amplifier, discharging low either the first or the second internal node, the signal discharged low depending on the logic value of the data input signal;
    responsive to the discharging low of the first or second internal node, disconnecting a connection between the data input signal and the inverted data input signal to the first and second internal nodes; and
    latching the logic level state of the first and second complementary output signals.

14. A method according to claim 13, wherein:

the operation of disconnecting the connection between the data input signal and the inverted data input signal to the first and second internal nodes terminates DC power consumption caused by potentially switching the data input signal.

15. A method according to claim 13, further comprising:

size ratioing a delay element in a pathway of the first complementary output signal and a delay element in a pathway of the second complementary output signal in favor of a high-to-low transition to enhance the response time of the output signals to the clock input signal.

* * * * *